(12) United States Patent
Sakai et al.

(10) Patent No.: US 8,896,004 B2
(45) Date of Patent: Nov. 25, 2014

(54) WHITE LED, BACKLIGHT USING THE SAME, AND LIQUID CRYSTAL DISPLAY DEVICE

(75) Inventors: Ryo Sakai, Yokohama (JP); Yasuhiro Shirakawa, Yokohama (JP); Hajime Takeuchi, Yokohama (JP); Tsutomu Ishii, Yokohama (JP); Yasumasa Ooya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 559 days.

(21) Appl. No.: 11/912,635

(22) PCT Filed: Apr. 25, 2006

(86) PCT No.: PCT/JP2006/308636
§ 371 (c)(1),
(2), (4) Date: Nov. 7, 2008

(87) PCT Pub. No.: WO2006/118104
PCT Pub. Date: Nov. 9, 2006

(65) Prior Publication Data
US 2009/0166652 A1 Jul. 2, 2009

(30) Foreign Application Priority Data

Apr. 26, 2005 (JP) .................................. 2005-128509

(51) Int. Cl.
*H01L 33/00* (2010.01)
*C09K 11/77* (2006.01)
*G02F 1/1335* (2006.01)
*H01L 33/50* (2010.01)

(52) U.S. Cl.
CPC ...... *G02F 1/133603* (2013.01); *C09K 11/7789* (2013.01); *C09K 11/7734* (2013.01); *C09K 11/778* (2013.01); *H01L 33/504* (2013.01); *H01L 33/502* (2013.01); *C09K 11/7739* (2013.01)

USPC .................. 257/98; 257/100; 257/E33.061

(58) Field of Classification Search
USPC ............................................................ 257/98
See application file for complete search history.

(56) References Cited

U.S. PATENT DOCUMENTS

| 5,982,092 | A | 11/1999 | Chen |
| 6,252,254 | B1 | 6/2001 | Soules et al. |
| 6,255,670 | B1 * | 7/2001 | Srivastava et al. ............... 257/89 |
| 6,469,322 | B1 * | 10/2002 | Srivastava et al. ............... 257/89 |
| 6,580,097 | B1 | 6/2003 | Soules et al. |
| 6,614,170 | B2 * | 9/2003 | Wang et al. .................... 313/498 |
| 6,809,781 | B2 * | 10/2004 | Setlur et al. ..................... 349/70 |

FOREIGN PATENT DOCUMENTS

| CN | 1480511 | 3/2004 |
| CN | 1289456 | 12/2006 |
| JP | 61-145279 | 7/1986 |
| JP | 3-269085 | 11/1991 |
| JP | 2000-73052 | 3/2000 |
| JP | 2000-144130 | 5/2000 |
| JP | 2001-119067 | 4/2001 |
| JP | 2002-76445 | 3/2002 |
| JP | 2002-105449 | 4/2002 |
| JP | 2002-531956 | 9/2002 |
| JP | 2002-314142 | 10/2002 |
| JP | 2004-168996 | 6/2004 |
| JP | 2004-179644 | 6/2004 |
| JP | 2004-221163 | 8/2004 |
| JP | 2004-235337 | 8/2004 |
| JP | 2004-331934 | 11/2004 |
| JP | 2004-342782 | 12/2004 |
| JP | 2004-359756 | 12/2004 |
| JP | 2004-363537 | 12/2004 |
| JP | 2005-19663 | 1/2005 |
| JP | 2005-26077 | 1/2005 |
| JP | 2005-64111 | 3/2005 |
| JP | 2005-93913 | 4/2005 |
| JP | 2005-93985 | 4/2005 |
| WO | WO 00/33390 | 6/2000 |
| WO | WO 2004/093203 A3 | 10/2004 |

OTHER PUBLICATIONS

Notification of First Office Action mailed by the Patent Office of the People's Republic of China on Jan. 9, 2009, in counterpart Chinese Application No. 2006800141287, and English translation thereof.

International Preliminary Report on Patentability and Written Opinion issued by International Bureau of WIPO on Oct. 30, 2007, for International Application No. PCT/JP2006/308636.
Srivastava et al., "Light Emitting Device with Phosphor Composition," English language abstract of WO 00/33390 (Jun. 8, 2000).
Office Action issued by the Taiwanese Patent Office on Jun. 30, 2011, for Taiwanese Patent Application No. 1002057044001, and English-language translation thereof.
Office Action issued by Taiwan Patent Office on Mar. 17, 2011, for Taiwanese Patent Application No. 095114949 and English language translation thereof.
Second Notification of Reason for Rejection issued by the Chinese Patent Office on Jun. 29, 2011, for Chinese Patent Application No. 200680014128.7, and English-language translation thereof.
Notification of Reason for Rejection issued by the Japanese Patent Office on Apr. 13, 2012, for Japanese Patent Application No. 2007-514739, and English-language translation thereof.
Decision of Rejection issued by the Japanese Patent Office on Dec. 21, 2012, for Japanese Patent Application No. 2007-514739, and English-language translation thereof.
Notification of Reason for Rejection issued by the Japanese Patent Office on Oct. 25, 2013, for Japanese Patent Application No. 2007-514739, and English-language translation thereof.
Official Action issued by the Taiwanese Patent Office on Sep. 30, 2013, for Taiwanese Patent Application No. 095114949, and English-language translation thereof.
Office Action issued by the Taiwanese Patent Office on Apr. 8, 2013, for Taiwanese Patent Application No. 095114949, and English-language translation thereof.
Notification of Reason for Rejection issued by the Japanese Patent Office on Jan. 24, 2014, for Japanese Patent Application No. 2007-514739, and English-language translation thereof.
Decision on Appeal issued by the Taiwanese Patent Office on Apr. 15, 2014, for Taiwanese Patent Application No. 095114949, and English-language translation thereof.
Decision on Trial issued by the Japanese Patent Office on May 20, 2014, for Japanese Patent Application No. 2007-514739, and English-language translation thereof.

\* cited by examiner

*Primary Examiner* — Jerome Jackson, Jr.
(74) *Attorney, Agent, or Firm* — Finnegan, Henderson, Farabow, Garrett & Dunner, L.L.P.

(57) ABSTRACT

Disclosed are a white LED, which has color reproducibility comparable with that of a cold-cathode tube and improved brightness, and a backlight and a liquid crystal display device comprising the white LED. The white LED comprises at least one light emitting element selected from ultraviolet light emitting diodes, purple light emitting diodes, ultraviolet light emitting lasers, and purple light emitting lasers, and a phosphor layer. The phosphor layer comprises a green phosphor satisfying formula 1, a blue phosphor satisfying formula 2 or 3, and a red phosphor satisfying formula 4 or 5:

a trivalent cerium- and terbium-activated rare earth boride phosphor represented by formula 1: $M_{1-x-y}Ce_xTb_yBO_3$ wherein M represents at least one element selected from Sc (scandium), Y (yttrium), La (lanthanum), Gd (gadolinium), and Lu (lutetium); and x and y are respective numbers of $0.03<x<0.3$ and $0.03<y<0.3$;

a divalent europium-activated halophosphate phosphor represented by formula 2: $(M2, Eu)_{10}(PO_4)_6.Cl_2$ wherein M2 represents Mg (magnesium), Ca (calcium), Sr (strontium), or Ba (barium), or a divalent europium-activated aluminate phosphor represented by formula 3: $a(M3, Eu)O.bAl_2O_3$ wherein M3 represents Mg (magnesium), Ca (calcium), Sr (strontium), Ba (barium), Zn (zinc), Li (lithium), Rb (rubidium), or Cs (cesium); and a and b are respective numbers of $0<a$, $0<b$, and $0.2 \leq a/b \leq 1.5$; and a europium-activated lanthanum oxysulfide phosphor represented by formula 4: $(La_{1-x}, Eu_x)_2O_2S$ wherein x is a number satisfying $0.01<x<0.15$), or a europium-activated yttrium oxysulfide phosphor represented by formula 5: $(Y_{1-x}, Eu_x)_2O_2S$ wherein x is a number satisfying $0.01<x<0.15$.

8 Claims, 3 Drawing Sheets

F I G. 3

WHITE LED, BACKLIGHT USING THE SAME, AND LIQUID CRYSTAL DISPLAY DEVICE

TECHNICAL FIELD

This invention provides a white LED suitable for backlights, for example, in liquid crystal display devices, a backlight using the same, and a liquid crystal display device.

BACKGROUND OF THE INVENTION

In recent years, the development of white LEDs having features such as compactness, prolonged service life, low-voltage drive, and freedom from mercury have been forwarded as an alternative to mercury gas excitation-type fluorescent lamps (FLs) and cold cathode ray tubes (CCFLs) which have hitherto been used, for example, general lighting and backlights for liquid crystal display devices.

White LEDs are classified into type 1 in which three color-light-emitting diodes, i.e., a red light emitting diode, a green light emitting diode, and a blue light emitting diode are used in combination to emit white light, and type 2 in which a light emitting diode with a long wavelength ultraviolet (300 to 430 nm) or blue wavelength (460 to 480 nm) light emitting diode as an excitation source is used in combination with a phosphor layer containing a plurality of types of visible light emitting phosphors to emit white light.

In type 1, since three color light sources are used, in order to produce white light, a mechanism for color mixing, for example, the use of a diffusive plate and the provision of a space for diffusion, is necessary rendering the thickness of the backlight large. Further, since three types of LEDs are used, for example, respective separate control circuits are necessary. Accordingly, the number of necessary components is increased, disadvantageously leading to increased cost. On the other hand, in type 2, all of LEDs used may be identical and emit the same color light. Accordingly, the mechanism for color mixing is unnecessary. Further, the use of only one control circuit suffices for contemplated results, and, thus, the number of necessary components can be reduced. Therefore, white LEDs can be produced at low cost.

As described above, white LEDs of type 2 are divided into those in which long wavelength ultraviolet (or purple) light emitting diodes are used, and those in which light emitting diodes, which emit blue light (460 to 480 nm), are used.

When an ultraviolet (or purple) light emitting diode is used, white light is produced by using visible light emitting phosphors of three colors, i.e., red, green, and blue in the phosphor layer. On the other hand, in the case of a blue light emitting diode, in many cases, white light is produced by using a yellow visible light emitting phosphor. It has been becoming apparent that, as compared with the use of the blue light emitting diode, the use of the ultraviolet light emitting diode can realize better color reproduction, because, in the case of the ultraviolet light emitting diode, three color phosphors are used for white light, in the case of the blue light emitting diode, two color phosphors are used for white light.

In white LED of type 2, unlike the excitation of a mercury gas at 254 nm in the prior art, the excitation is carried out at long wavelength ultraviolet (300 to 430 nm) or blue wavelength (460 to 480 nm), and, thus, phosphors used in current FLs and CCFLs cannot in many cases be used.

In particular, $LaPO_4$:Ce,Tb commonly used as a green phosphor in FLs and CCFLs does not substantially emit light at 320 to 430 nm. To overcome this problem, Japanese Patent Laid-Open No. 73052/2000 (patent document 1) uses $BaMgAl_{10}O_{17}$:Eu,Mn (a composition satisfying a general formula in paragraph [0029] in patent document 2) as a green component. Since, however, the emission wavelength of this material is 515 nm, which is shorter than the emission wavelength 543 nm of the conventional material $LaPO_4$:Ce,Tb, this cannot be fully alternative to the conventional material. Therefore, for example, a problem of lowered color rendering properties takes place in illumination applications.

On the other hand, in liquid crystal display devices, the color reproduction range as the display device is determined by a combination of backlight with a color filter. For example, in a liquid crystal display device provided with backlight using CCFL, mere replacement of CCFL with white LED does not improve the characteristics of the liquid crystal display device. This is because the color filter is designed according to color reproduction range of light emitted from CCFL. In other words, mere change of the light source from CCFL to white LED does not always improve the characteristics of the liquid crystal display device.

For example, U.S. Pat. No. 6,252,254 (B1) (patent document 2) discloses a white LED using $YBO_3$:$Ce^{3+}$,$Tb^{3+}$ phosphor (a cerium- and terbium-activated yttrium borate phosphor) as a green phosphor and a $Y_2O_2S$:$Eu^{3+}$, $Bi^{3+}$ phosphor (europium- and bismuth-activated yttrium oxysulfide phosphor) as a red phosphor. In patent document 2, however, since a blue light emitting diode is used, the color reproduction range particularly in the blue part is disadvantageously fixed by luminescence characteristics of the blue light emitting diode. Accordingly, the color reproduction range is different from that in CCFL, and, thus, when the white LED disclosed in patent document 2 is used in a liquid crystal display device in which the conventional CCFL has been used, the design of the color filter should be changed.

Accordingly, a white LED, which has good color reproducibility, that is, can realize a wide range of regulation of the color reproduction range, and, at the same time, despite the use of a light emitting diode, which emits light by a long wavelength ultraviolet (300 to 430 nm), has a color reproduction range comparable with that in conventional FL or CCFL has been desired.

[Patent document 1] Japanese Patent Laid-Open No. 73052/2000

[Patent document 2] U.S. Pat. No. 6,252,254 (B1)

DISCLOSURE OF THE INVENTION

Problems to be Solved by the Invention

In recent years, liquid crystal display devices have been used in various screens (monitors), for example, small screens in portable (cellular) phones, car navigation systems, and mobile communication equipment, and medium/large screens in personal computers and television sets, and CCFLs have been mainly used as the backlight source.

When such CCFLs are used as the light source, for example, various optical members such as color filters have hitherto been proposed from the viewpoint of improving the quality of light from CCFL to improve color reproducibility. The color filter is designed to provide the best display quality, color reproducibility and other properties in particular applications by taking into consideration, for example, characteristics of light emitted from CCFL, and, at the present time, a number of satisfactory color filters for CCFLs have bee provided.

In recent years, an increasing demand for freedom from mercury from the viewpoint of an environmental problem has led to an attempt to utilize LED as a light source instead of CCFL. Since, however, the luminescent color of the conventional white LED is significantly different from that of CCFL, mere replacement of CCFL with white LED in the liquid crystal display device cannot provide good display quality, color reproduction range and other properties, and, further, the utilization of a color filter designed to be suitable for CCFL has also been impossible.

For the above reason, when the conventional white LED is used as a light source, the color filter should have also been redesigned so that the color filter is suitable for the characteristics of light emitted from the white LED or the color reproduction range of the white LED. It is needless to say that a high cost and a lot of time are necessary for newly designing the color filter and developing a technique for stably producing the newly designed color filter. Accordingly, the development of white LED in which the conventional CCFL color filter as such can be used, has been desired.

An object of the present invention is to provide a white LED, which has a color reproduction range comparable with that of the conventional CCFL and has significantly improved brightness, a backlight and a liquid crystal display device.

Means for Solving Problem

The present invention can be attained by a white LED comprising at least one light emitting element selected from ultraviolet light emitting diodes, purple light emitting diodes, ultraviolet light emitting lasers, and purple light emitting lasers, and a phosphor layer, characterized in that the phosphor layer comprises a green phosphor satisfying general formula 1, a blue phosphor satisfying general formula 2 or 3, and a red phosphor satisfying general formula 4 or 5.

<Green Phosphor>
A trivalent cerium- and terbium-activated rare earth boride phosphor substantially represented by $$M_{1-x-y}Ce_xTb_yBO_3 \qquad \text{general formula 1}$$

wherein M represents at least one element selected from Sc (scandium), Y (yttrium), La (lanthanum), Gd (gadolinium), and Lu (lutetium); and x and y are respective numbers of $0.03<x<0.3$ and $0.03<y<0.3$.

<Blue Phosphor>
A divalent europium-activated halophosphate phosphor substantially represented by $$(M2,Eu)_{10}(PO_4)_6 \cdot Cl_2 \qquad \text{general formula 2}$$

wherein M2 represents at least one element selected from Mg (magnesium), Ca (calcium), Sr (strontium), and Ba (barium) or a divalent europium-activated aluminate phosphor substantially represented by $$a(M3,Eu)O \cdot bAl_2O_3 \qquad \text{general formula 3}$$

wherein M3 represents at least one element selected from Mg (magnesium), Ca (calcium), Sr (strontium), Ba (barium), Zn (zinc), Li (lithium), Rb (rubidium), and Cs (cesium); and a and b are respective numbers satisfying $0<a$, $0<b$, and $0.2 \leq a/b \leq 1.5$.

<Red Phosphor>
A europium-activated lanthanum oxysulfide phosphor represented by $$(La_{1-x},Eu_x)_2O_2S \qquad \text{general formula 4}$$

wherein x is a number satisfying $0.01<x<0.15$ or a europium-activated yttrium oxysulfide phosphor represented by $$(Y_{1-x},Eu_x)_2O_2S \qquad \text{general formula 5}$$

wherein x is a number satisfying $0.01<x<0.15$.

In a preferred embodiment of the present invention, the light emitting element in the white LED according to the present invention has an emission wavelength of 300 to 430 nm.

In a preferred embodiment of the present invention, in the white LED, the phosphor has an average particle diameter of not less than 1 μm.

In a preferred embodiment of the present invention, in the white LED, the phosphor layer comprises the green phosphor, the blue phosphor and the red phosphor each dispersed in a transparent resin material.

In a preferred embodiment of the present invention, in the white LED, the transparent resin material has a refractive index of 1.3 to 1.7.

According to the present invention, there is also provided a backlight characterized by comprising the white LED.

In a preferred embodiment of the present invention, the backlight comprises a plurality of the above white LEDs.

According to the present invention, there is further provided a liquid crystal display device characterized by comprising the above backlight.

Effect of the Invention

The white LED according to the present invention has a high level of brightness.

Further, since the white LED according to the present invention has a color reproduction range as comparable with that in CCFL, the conventional color filter for CCFLs as such can be used. Accordingly, In the backlight using the white LED according to the present invention and the liquid crystal display device using the backlight, there is no need to redesign a new color filter. The expression "color reproduction range comparable with that in CCFLs" as used herein means that the results measured with a spectrometer for the color reproduction range are identical or substantially identical to those for the color reproduction range in CCFLs.

Further, in the white LED according to the present invention, also when the characteristics of the color filter are further improved as desired, the technique or finding used in the conventional color filter for CCFLs, the contemplated color filter can very easily be provided.

Unlike the conventional CCFL, in the white LED, backlight, and liquid crystal display device according to the present invention, since there is no need to use mercury, any environmental problem does not take place.

BEST MODE FOR CARRYING OUT THE INVENTION

Figure 1:
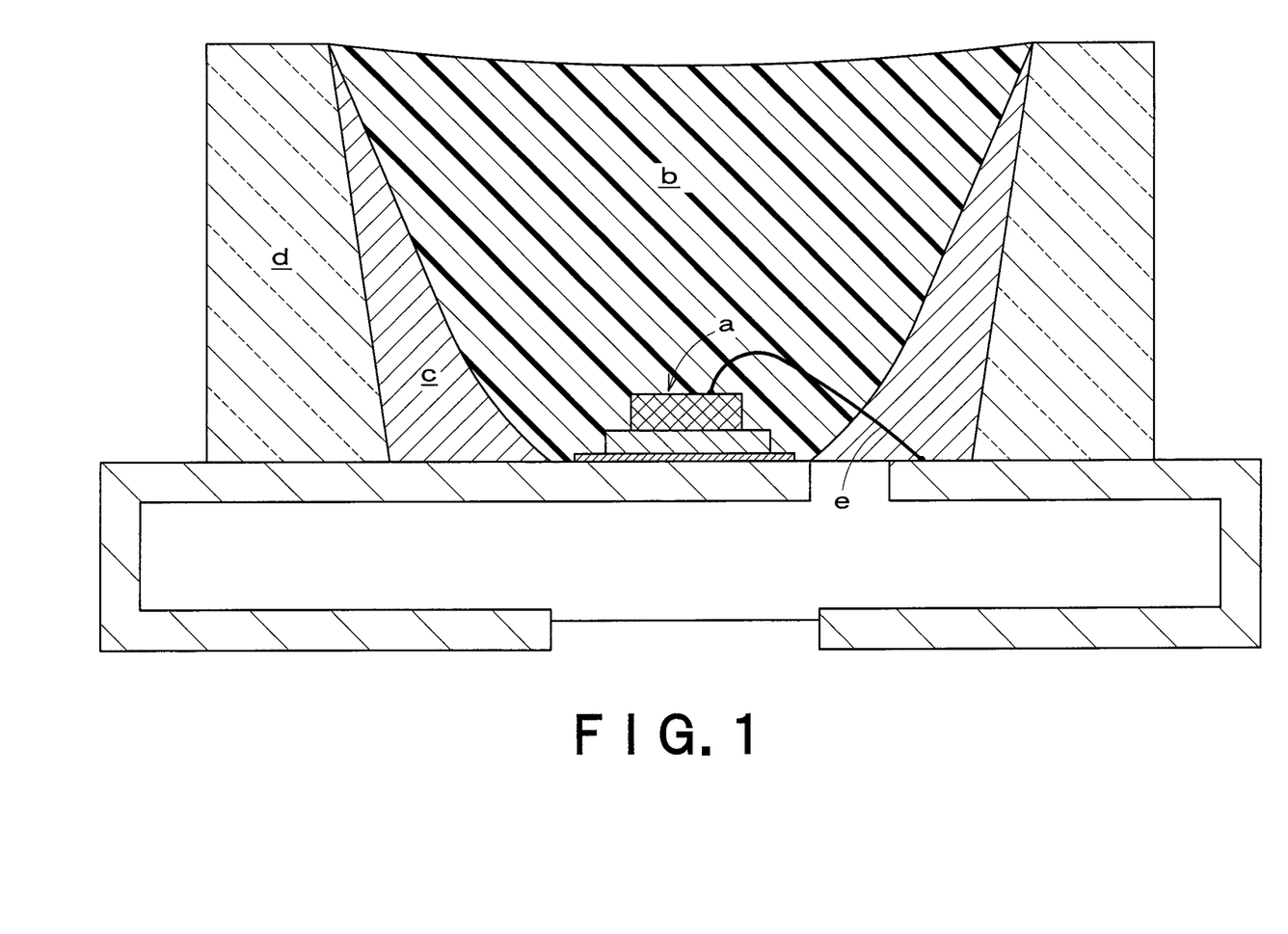
FIG. 1 is a cross-sectional view of one embodiment of the white LED according to the present invention.

FIG. 1 is a cross-sectional view of one embodiment of the white LED according to the present invention. In FIG. 1, character a designates a light emitting diode, character b a phosphor layer embedded in a resin, character c a reflective layer for guiding light emitted form the light emitting diode and a phosphor to the outside of the white LED, and character d a resin frame for supporting a light emitting part. Electric energy applied through wiring e to an LED lamp is converted to ultraviolet light or purple light by the light emitting diode which is converted to light with a longer wavelength by the phosphor layer provided on the upper part of the light emitting diode, and white light is released to the outside of the LED lamp on the whole.

Various diodes such as InGaN-base, GaN-base, and AlGaN-base diodes are applicable to the ultraviolet light emitting diode or purple light emitting diode. In particular, the light emitting diode with an emission wavelength peak value of 300 to 430 nm, when used in combination with phosphors described later, can advantageously realize a better white LED having high brightness and better color reproducibility. An ultraviolet light emitting diode or purple light emitting diode having an emission wavelength peak value of 300 to 430 nm is preferred because it, when used in combination with the phosphor described later, can provide a higher level of brightness. Instead of the ultraviolet light emitting diode or purple light emitting diode, an ultraviolet light emitting laser or a purple light emitting laser may be used. In the present invention, the ultraviolet light emitting diode, purple light emitting diode, ultraviolet light emitting laser, and purple light emitting laser are collectively referred to as a light emitting element.

Regarding the phosphor used in the phosphor layer b, the use of a visible light emitting phosphor is important. The use of at least one green phosphors, at least one of blue phosphors, and at least one of red phosphors is preferred as the visible light phosphor. Each of the phosphors will be described.

The green phosphor should satisfy the following general formula 1.

Green phosphor: a trivalent cerium- and terbium-activated rare earth boride phosphor substantially represented by $M_{1-x-y}Ce_xTb_yBO_3$   general formula 1 wherein M represents at least one element selected from Sc (scandium), Y (yttrium), La (lanthanum), Gd (gadolinium), and Lu (lutetium); and x and y are respective numbers of $0.03<x<0.3$ and $0.03<y<0.3$.

The element M may be at least one element selected from Sc (scandium), Y (yttrium), La (lanthanum), Gd (gadolinium), and Lu (lutetium). These elements are trivalent and have an ion radius of 0.07 to 0.11 nm and thus are likely to take a structure of $MBO_3$. A crystal which emits light can be provided by replacing a part of element M with Tb (terbium) and Ce (cerium).

Further, two or more elements may be selected from Sc, Y, La, Gd, and Lu as the element M. For example, when the total amount of the element M is 100 (at) %, the element M may comprises not less than 1 at % and less than 100 at % of Lu with the balance consisting of one or at least two elements selected from Sc, Y, La, and Gd.

Upon replacement with $Ce^{3+}$ and $Tb^{3+}$, excitation light (300 to 430 nm) emitted from the light emitting element is first absorbed in $Ce^{3+}$ ions, and the absorbed energy is transmitted to $Tb^{3+}$ ions, resulting in emission of green light. x and y values showing the replacement level are $0.03<x<0.3$ and $0.03<y<0.3$, respectively. When the x value is not more than 0.03, the energy is not sufficiently absorbed in $Ce^{3+}$. Accordingly, a sufficient quantity of energy is not transmitted to $Tb^{3+}$ and, consequently, the emission of green light from $Tb^{3+}$ is not satisfactory. On the other hand, when the x value is not less than 0.30, the luminous efficiency is disadvantageously lowered. Likewise, when the y value is not more than 0.03, the amount of $Tb^{3+}$ which receives energy transmitted from $Ce^{3+}$ is unsatisfactory resulting in unsatisfactory green light emission. When the y value is not less than 0.3, the luminous efficiency is disadvantageously lowered.

The production process of a green phosphor is not particularly limited, and, for example, the following method may be mentioned. At the outset, at least one of scandium oxide ($SC_2O_3$), lanthanum oxide ($La_2O_3$), and ruthenium oxide ($Lu_2O_3$), and cerium oxide ($CeO_2$), terbium oxide ($Tb_4O_7$), and hydrogen borate ($H_3BO_3$) are weighed in respective predetermined amounts so as to give a composition represented by general formula 1, and they are thoroughly mixed with a firing aid. The starting material mixture is placed, for example, in an alumina crucible and is fired at a temperature of about 1100 to 1400° C. for about 3 to 6 hr. Thereafter, the fired product is washed with pure water to remove unnecessary soluble components. The residue is then filtered and dried to provide a contemplated green phosphor.

Next, the blue phosphor will be described. The blue phosphor should be a phosphor satisfying the following general formula 2 or 3. One type of blue phosphor represented by general formula 2 or 3 or two types of blue phosphors represented by formulae 2 and 3 may be used.

Blue phosphor: a divalent europium-activated halophosphate phosphor substantially represented by $(M2,Eu)_{10}(PO_4)_6.Cl_2$   general formula 2 wherein M2 represents at least one element selected from Mg (magnesium), Ca (calcium), Sr (strontium), and Ba (barium) or a divalent europium-activated aluminate phosphor substantially represented by $a(M3,Eu)O.bAl_2O_3$   general formula 3 wherein M3 represents at least one element selected from Mg (magnesium), Ca (calcium), Sr (strontium), Ba (barium), Zn (zinc), Li (lithium), Rb (rubidium), and Cs (cesium); and a and b are respective numbers satisfying $0<a$, $0<b$, and $0.2 \leq a/b \leq 1.5$;

Finally, the red phosphor will be described. The red phosphor should be a phosphor satisfying general formula 4 or 5. One type of red phosphor represented by general formula 4 or 5 or two types of red phosphors represented by formulae 4 and 5 may be used.

Red phosphor: a europium-activated lanthanum oxysulfide phosphor represented by $(La_{1-x},Eu_x)_2O_2S$   general formula 4 wherein x is a number satisfying $0.01<x<0.15$ or a europium-activated yttrium oxysulfide phosphor represented by $(Y_{1-x},Eu_x)_2O_2S$   general formula 5 wherein x is a number satisfying $0.01 \leq x \leq 0.15$.

Regarding the phosphors represented by general formulae 2, 3, 4 and 5, preferably, proper phosphors are selected, for example, according to excitation wavelength, demand for brightness, corrosion resistance, and cost.

The white LED according to the present invention contains the above green phosphor, blue phosphor, and red phosphor in its phosphor layer. The green phosphor, blue phosphor, and red phosphor efficiently absorbs ultraviolet light upon exposure to ultraviolet light (or purple light) with a wavelength of 300 to 430 nm emitted from a light emitting element such as a ultraviolet light emitting diode to emit each color light with high efficiency. In other words, the green phosphor emits a highly bright green color light, the blue phosphor emits a highly bright blue color light, and the red phosphor emits a highly bright red color light. As a result, a highly bright white light can be provided.

For example, in the case of white LED shown in FIG. 1, electric energy applied to the light emitting diode a is converted by the light emitting diode to ultraviolet light (or purple light), and these lights are converted to longer-wavelength light by the phosphor layer provided on the upper part of the light emitting diode, whereby white light is released on the whole to the outside of the LED.

In the present invention, the ultraviolet light emitting diode or purple light emitting diode used in the light emitting diode a is designated as a light emitting diode, and the completed white light emitting diode is designated as white LED.

Increasing the average particle diameter of each phosphor is also effective for further enhancing the brightness. The average particle diameter is preferably large and is not less than 1 μm, more preferably not less than 10 μm. The average particle diameter may be increased, for example, by a method in which a firing aid is used in firing the phosphor, or a method in which firing at an elevated temperature for a long period of time is carried out. The upper limit of the average particle diameter is not particularly limited.

The production process of the white LED is not particularly limited. Examples of production processes usable herein include a process in which, for each of the phosphors for respective colors, a mixture of a phosphor powder with a resin material is prepared, and the mixtures thus prepared are mixed together to prepare a mixed phosphor, or a process in which phosphor powders for respective colors are previously mixed together, and the mixture is then mixed with a resin material to prepare a mixed phosphor.

Preferably, the resin material used in the present invention is colorless and transparent and has a predetermined light refractive index. In the present invention, preferably, the transmittance (as measured by using a 2 mm-thick specimen for a monochromatic light (400 nm)) is 98 to 100%, particularly preferably 99 to 100%, and the light refractive index is 1.3 to 1.7, particularly preferably 1.4 to 1.6. When the light refractive index is less than 1.3, the takeout of light from the light emitting diode element is disadvantageously deteriorated. On the other hand, when the light refractive index is more than 1.7, in some cases, the takeout of light from the phosphor layer is disadvantageously deteriorated. Preferably, the resin material used in the present invention is satisfactorily durable against ultraviolet light used for the excitation of the phosphor, or against thermal conditions exposed under production conditions or service conditions. Further, preferably, the resin material is small in a change in volume caused by various conditions exposed under production conditions or service conditions or small in adverse effect caused by volume expansion. The use of this soft resin material can effectively prevent the deformation of the resin frame d and (or) breaking of the wiring e.

In the present invention satisfying the above requirements, for example, silicone resins and epoxy resins may be mentioned as a particularly preferred resin material. Among them, silicone resins are preferred because they are less likely to cause a color change upon exposure to ultraviolet light and are durable.

The white LED may be formed by coating the mixed phosphor onto a light emitting diode and curing the resin. The construction of the substrate, metal frame (reflector) and the like used in the white LED may be any desired one.

In the white LED, white light having a high level of brightness can be provided. The above white LED is useful in a backlight, particularly in a backlight in liquid crystal display devices.

Figure 2:
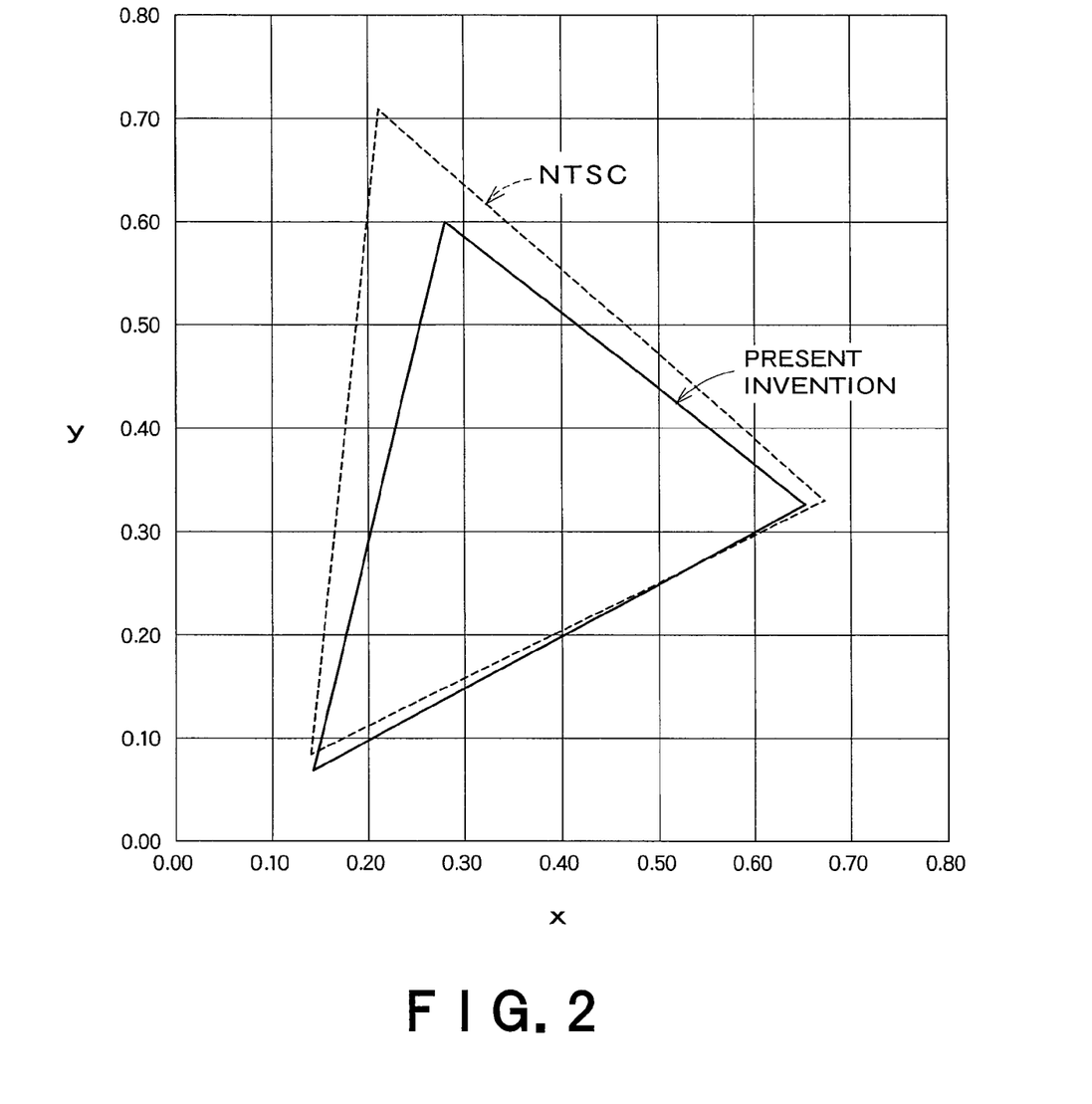
FIG. 2 is a diagram showing one example of the color reproducibility when the white LED according to the present invention has been used as a backlight in the liquid crystal display device.

FIG. 2 is a plot of one example of a CIE chromaticity diagram of luminescent colors obtained by passing light emitted from the white LED according to the present invention through conventional blue, green and red color filters used in a liquid crystal display device. In the chromaticity diagram, light of chromaticity within a triangle obtained by connecting blue, green, and red luminous points to each other can be rendered by the liquid crystal display device.

Figure 3:
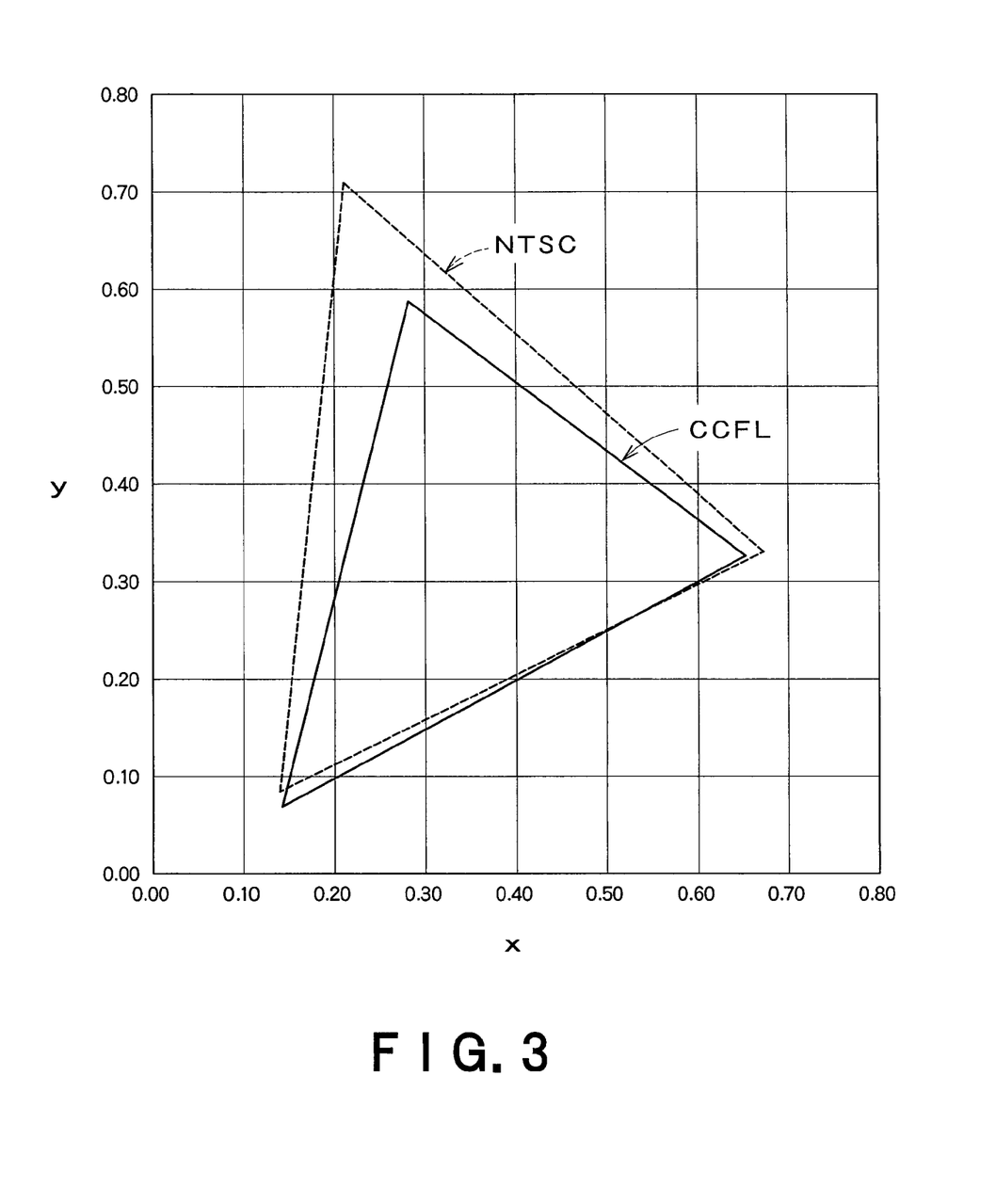
FIG. 3 is a diagram showing one example of the color reproducibility when the conventional CCFL has been used as a backlight in a liquid crystal display device.

The larger the area of the triangle, the larger the light chromaticity which can be rendered. Accordingly, in this case, the color reproduction range of the liquid crystal display device is wider (i.e., has better color reproducibility). FIG. 3 shows a color reproduction range of a liquid crystal display used in a conventional cold cathode ray tube (CCFL). As can be seen from FIG. 3, the color reproduction range is substantially the same as that shown in FIG. 2.

FIGS. 2 and 3 also show a color reproduction range determined by National Television Standards Committee (NTSC). The area of the color reproduction range is expressed as a relative value by presuming the area of the triangle of NTSC to be 100, and the color reproduction range of a preferred liquid crystal display device according to the present invention was 67 while the color reproduction range of a liquid crystal display device using the conventional CCFL was 65.

The white LED according to the present invention has a color reproduction range equivalent to or slightly wider than the conventional CCFL. Accordingly, conventional color filters designed so as to be suitable for CCFLs can also be utilized, and, at the same time, wide color reproducibility comparable favorably with that in the prior art technique can be realized.

The backlight and liquid crystal display device using the above white LED are suitable in various liquid crystal display devices, for example, in small screens in portable (cellular) phones, car navigation systems, and mobile communication equipment, and medium/large screens in personal computers and television sets. In particular, since the color reproducibility is similar to that in the liquid crystal display device using the conventional CCFL, there is no need to change the design of color filters and the like.

Further, the white LED has a high level of brightness and thus can be applied both a side light-type backlight and a direct backlight. When the white LED is applied to the backlight, if necessary, a plurality of white LEDs are preferably used.

EXAMPLES

Examples 1 to 8

A structure having a cross section shown in FIG. 1 was adopted for evaluating white LEDs prepared in the Examples. An ultraviolet light emitting diode having a size of 300 μm square was provided in a light emitting element. Each phosphor having an average particle diameter of 5 μm was mixed with a silicone resin to prepare a slurry. The slurry was dropped on the ultraviolet light emitting diode, and the coated ultraviolet light emitting diode was heat treated at 100 to 150° C. to cure the silicone resin and thus to form white LEDs of respective Examples. In each Example, the phosphors were mixed so as to provide color development shown in a coordinate (x=0.3, y=0.3) in FIG. 2. Each silicone resin after curing had a refractive index of 1.5.

The wavelength of the ultraviolet light emitting diode and the compositions of respective phosphors were as shown in Table 1.

Comparative Examples 1 to 5

White LEDs of Comparative Examples were produced in the same manner as in Example 1, except that the compositions of phosphors for respective colors were outside the scope of the present invention.

The brightness of the white LEDs of each of the Examples and Comparative Examples was measured. The brightness was measured by a total luminous flux measurement method. Specifically, light was emitted from each white LED by applying a current of 40 mA, and the brightness was measured with a 10-inch integrating sphere (DAS-2100) manufactured by labshere. The results are shown in Table 1.

Examples 11 to 20 and Comparative Examples 6 to 8

The white LEDs of Examples 1 to 10 and Comparative Examples 1 to 3 were provided. Backlights for liquid crystal display devices were constructed by using the LEDs in combination with red (R), green (G), and blue (B) color filters commonly used in liquid crystal display devices.

Light passed through the color filter was led to an integrating sphere to evaluate developed colors of red (R), green (G), and blue (B) and thus to examine color reproduction region (color reproducibility) provided in the form of a liquid crystal display device (display). For the color reproducibility, the coordinate of green luminous point was measured using a CIE chromaticity diagram shown in FIG. 2. For comparison, a green luminescence coordinate for CCFL was also examined. The results are shown in Table 3.

TABLE 1

| | Blue phosphor | Green phosphor | Red phosphor | Excitation wavelength of light emitting element (nm) | Total luminous flux (lm) |
|---|---|---|---|---|---|
| Example 1 | $(Sr_{0.97}Ca_{0.02}Eu_{0.01})_{10}(PO_4)_6 \cdot Cl_2$ | $Lu_{0.8}Ce_{0.1}Tb_{0.1}BO_3$ | $(La_{0.89}Eu_{0.11})_2O_2S$ | 370 | 1.12 |
| Example 2 | $(Sr_{0.97}Ca_{0.02}Eu_{0.01})_{10}(PO_4)_6 \cdot Cl_2$ | $Lu_{0.5}Y_{0.3}Ce_{0.1}Tb_{0.1}BO_3$ | $(La_{0.89}Eu_{0.11})_2O_2S$ | 370 | 1.09 |
| Example 3 | $(Sr_{0.99}Eu_{0.01})_{10}(PO_4)_8 \cdot Cl_2$ | $Lu_{0.9}Ce_{0.05}Tb_{0.05}BO_3$ | $(Y_{0.94}Eu_{0.06})_2O_2S$ | 370 | 1.02 |
| Example 4 | $(Ba_{0.75}Eu_{0.25})MgAl_{10}O_{17}$ | $Lu_{0.7}Ce_{0.1}Tb_{0.2}BO_3$ | $(La_{0.89}Eu_{0.11})_2O_2S$ | 370 | 0.98 |
| Example 5 | $(Sr_{0.97}Ca_{0.02}Eu_{0.01})_{10}(PO_4)_6 \cdot Cl_2$ | $Sc_{0.8}Ce_{0.1}Tb_{0.1}BO_3$ | $(Y_{0.94}Eu_{0.06})_2O_2S$ | 320 | 0.52 |
| Example 6 | $(Sr_{0.97}Ca_{0.02}Eu_{0.01})_{10}(PO_4)_6 \cdot Cl_2$ | $Y_{0.8}Ce_{0.1}Tb_{0.1}BO_3$ | $(Y_{0.94}Eu_{0.06})_2O_2S$ | 400 | 0.34 |
| Example 7 | $(Sr_{0.97}Ba_{0.23}Ca_{0.01}Eu_{0.01})_{10}(PO_4)_6 \cdot Cl_2$ | $La_{0.6}Ce_{0.1}Tb_{0.1}BO_3$ | $(La_{0.89}Eu_{0.11})_2O_2S$ | 340 | 0.32 |
| Example 8 | $(Sr_{0.97}Ca_{0.02}Eu_{0.01})_{10}(PO_4)_6 \cdot Cl_2$ | $Gd_{0.8}Ce_{0.1}Tb_{0.1}BO_3$ | $(La_{0.89}Eu_{0.11})_2O_2S$ | 380 | 0.45 |
| Comp. Ex. 1 | $(Sr_{0.97}Ca_{0.02}Eu_{0.01})_{10}(PO_4)_6 \cdot Cl_2$ | $La_{0.8}Ce_{0.1}Tb_{0.1}PO_4$ | $(La_{0.89}Eu_{0.11})_2O_2S$ | 360 | 0.05 |
| Comp. Ex. 2 | $(Sr_{0.97}Ca_{0.02}Eu_{0.01})_{10}(PO_4)_6 \cdot Cl_2$ | $Lu_{0.5}Ce_{0.1}Tb_{0.4}BO_3$ | $(La_{0.89}Eu_{0.11})_2O_2S$ | 370 | 0.08 |
| Comp. Ex. 3 | $(Sr_{0.97}Ca_{0.02}Eu_{0.01})_{10}(PO_4)_6 \cdot Cl_2$ | $Lu_{0.95}Ce_{0.2}Tb_{0.03}BO_3$ | $(La_{0.89}Eu_{0.11})_2O_2S$ | 370 | 0.12 |
| Comp. Ex. 4 | $(Sr_{0.97}Ca_{0.02}Eu_{0.01})_{10}(PO_4)_6 \cdot Cl_2$ | $Lu_{0.8}Ce_{0.1}Tb_{0.1}BO_3$ | $(Y_{0.89}Eu_{0.11})_2O_3$ | 360 | 0.03 |
| Comp. Ex. 5 | $CaWO_4$ | $Lu_{0.5}Y_{0.3}Ce_{0.1}Tb_{0.1}BO_3$ | $(La_{0.89}Eu_{0.11})_2O_2S$ | 370 | 0.02 |

As is apparent from Table 1, the white LEDs of the Examples according to the present invention had high brightness.

Examples 9 and 10

Next, white LEDs were produced in the same manner as in Example 2, except that the average particle diameter of the phosphor was varied. The brightness of the white LEDs thus obtained was measured in the same manner as in Example 2.

Specifically, for Example 9, each phosphor was fired at an elevated temperature for a long period of time to bring the average particle diameter to 10 μm, and, for Example 10, each phosphor was fired with a firing aid at an elevated temperature for a long period of time to bring the average particle diameter to 15 μm. The results are shown in Table 2.

TABLE 2

| | Total luminous flux (1 m) |
|---|---|
| Example 9 | 1.25 |
| Example 10 | 1.48 |

As is apparent from Table 2, in the case of an identical phosphor, the larger the average particle diameter, the higher the brightness.

TABLE 3

| | | Green chromaticity of light passed through filter | |
|---|---|---|---|
| Backlight | White LED | x coordinate | y coordinate |
| Example 11 | Example 1 | 0.283 | 0.589 |
| Example 12 | Example 2 | 0.284 | 0.588 |
| Example 13 | Example 3 | 0.284 | 0.587 |
| Example 14 | Example 4 | 0.283 | 0.588 |
| Example 15 | Example 5 | 0.282 | 0.589 |
| Example 16 | Example 6 | 0.283 | 0.587 |
| Example 17 | Example 7 | 0.283 | 0.587 |
| Example 18 | Example 8 | 0.283 | 0.588 |
| Example 19 | Example 9 | 0.284 | 0.587 |
| Example 20 | Example 10 | 0.283 | 0.588 |
| Comp. Ex. 6 | Comp. Ex. 1 | 0.282 | 0.586 |
| Comp. Ex. 7 | Comp. Ex. 2 | 0.283 | 0.589 |
| Comp. Ex. 8 | Comp. Ex. 3 | 0.282 | 0.589 |
| CCFL | — | 0.282 | 0.587 |

As is apparent from Table 3, the liquid crystal display devices of the Examples according to the present invention had excellent color reproducibility. For Comparative Examples 6 and 7, since the green phosphors are the same as in Examples 1 and 2, the green chromaticity values (x coordinate, y coordinate) were similar to the values in Examples 11 and 12.

Example 21

A white LED according to the present invention was produced in the same manner as in Example 1, except that a resin material having a refractive index of 1.3 was used. The brightness of the white LED was measured in the same manner as in Example 1. The results are shown in Table 4.

Example 22

A white LED according to the present invention was produced in the same manner as in Example 2, except that a resin material having a refractive index of 1.3 was used. The brightness of the white LED was measured in the same manner as in Example 2. The results are shown in Table 4.

TABLE 4

| | Total luminous flux (1 m) |
|---|---|
| Example 21 | 1.01 |
| Example 22 | 0.98 |

The invention claimed is:

1. A white LED comprising at least one light emitting element selected from ultraviolet light emitting diodes, purple light emitting diodes, ultraviolet light emitting lasers, and purple light emitting lasers, and a phosphor layer, the phosphor layer comprising a green phosphor satisfying general formula 1, a blue phosphor satisfying general formula 2 or 3, and a red phosphor satisfying general formula 4:

green phosphor: a trivalent cerium- and terbium-activated rare earth boride phosphor substantially represented by $M_{1-x-y}Ce_xTb_yBO_3$  general formula 1 wherein M represents at least one element selected from Sc (scandium), Y (yttrium), La (lanthanum), Gd (gadolinium), and Lu (lutetium); and x and y are respective numbers of 0.05<x<0.1 and 0.05<y<0.2;

blue phosphor: a divalent europium-activated halophosphate phosphor substantially represented by $(M2,Eu)_{10}(PO_4)_6—Cl_2$  general formula 2 wherein M2 represents at least one element selected from Mg (magnesium), Ca (calcium), Sr (strontium), and Ba (barium) or a divalent europium-activated aluminate phosphor substantially represented by $a(M3,Eu)O.bAl_2O_3$  general formula 3 wherein M3 represents at least one element selected from Mg (magnesium), Ca (calcium), Sr (strontium), Ba (barium), Zn (zinc), Li (lithium), Rb (rubidium), and Cs (cesium);

and a and b are respective numbers of 0<a, 0<b, and 0.2≤a/b≤1.5; and red phosphor: a europium-activated lanthanum oxysulfide phosphor represented by $(La_{1-x},Eu_x)_2O_2S$  general formula 4 wherein x is a number satisfying 0.01<x<0.15, wherein the white LED is for backlight in liquid crystal display devices.

2. The white LED according to claim 1, wherein the light emitting element has an emission wavelength of 300 to 430 nm.

3. The white LED according to claim 1 or 2, wherein the phosphor has an average particle diameter of not less than 1 µm.

4. The white LED according to claim 1, wherein the phosphor layer comprises the green phosphor, the blue phosphor and the red phosphor each dispersed in a transparent resin material.

5. The white LED according to claim 4, wherein the transparent resin material is a silicone resin having a refractive index of 1.3 to 1.7.

6. A backlight comprising a white LED according to claim 1.

7. A liquid display device comprising a backlight according to claim 6.

8. The liquid display device of claim 7 comprising a conventional color filter for CCFL for filtering the white LED according to claim 1.

* * * * *